(12) United States Patent
Yamada

(10) Patent No.: US 9,395,405 B2
(45) Date of Patent: Jul. 19, 2016

(54) WAFER INSPECTION INTERFACE AND WAFER INSPECTION APPARATUS

(71) Applicant: Tokyo Electron Limited, Tokyo (JP)

(72) Inventor: Hiroshi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 100 days.

(21) Appl. No.: 13/787,956

(22) Filed: Mar. 7, 2013

(65) Prior Publication Data

US 2013/0234745 A1 Sep. 12, 2013

(30) Foreign Application Priority Data

Mar. 9, 2012 (JP) ................................. 2012-052914

(51) Int. Cl.
*G01R 1/44* (2006.01)
*G01R 31/26* (2014.01)
*G01R 31/28* (2006.01)

(52) U.S. Cl.
CPC .............. *G01R 31/2601* (2013.01); *G01R 1/44* (2013.01); *G01R 31/2863* (2013.01); *G01R 31/2875* (2013.01)

(58) Field of Classification Search
CPC ... G01R 1/44; G01R 31/2601; G01R 31/2863
USPC ............... 324/50.01, 750.03, 762.01, 762.05, 324/754.01–754.03, 755.01, 755.03, 324/755.05–755.07, 756.03
See application file for complete search history.

(56) References Cited

U.S. PATENT DOCUMENTS

| 6,580,282 | B1* | 6/2003 | Lieutard et al. ........... 324/750.07 |
| 2006/0255814 | A1* | 11/2006 | Eldridge ............ G01R 31/2863 324/750.03 |
| 2008/0116925 | A1* | 5/2008 | Sunohara et al. ............. 324/761 |
| 2008/0240891 | A1 | 10/2008 | Obikane |
| 2010/0201391 | A1* | 8/2010 | Gunji et al. ................... 324/760 |
| 2010/0327891 | A1* | 12/2010 | Hobbs ...................... 324/750.03 |

FOREIGN PATENT DOCUMENTS

| CN | 101276771 A | 10/2008 |
| JP | 2000-138268 A | 5/2000 |
| JP | 2004-140241 A | 5/2004 |
| JP | 2006-162476 A | 6/2006 |
| JP | 2007-208138 A | 8/2007 |
| JP | 2008-128838 A | 6/2008 |
| JP | 2010-243352 A | 10/2010 |
| JP | 2011-145279 A | 7/2011 |
| TW | 200823472 A | 6/2008 |

\* cited by examiner

*Primary Examiner* — Tung X Nguyen
*Assistant Examiner* — Feba Pothen
(74) *Attorney, Agent, or Firm* — Pearne & Gordon LLP

(57) ABSTRACT

A wafer inspection interface 18 includes a probe card 20 having multiple probes 25 at a surface of the probe card 20 facing a wafer W, the probes 25 being arranged to correspond to electrodes of multiple semiconductor devices formed on the wafer W; a pogo frame 40 that is in contact with a surface of the probe card 20 opposite to the surface of the probe card 20 facing the wafer W and supports the probe card 20; and a sheath heater 44 provided in the pogo frame 40. The sheath heater 44 is provided along respective sides of through holes 43 formed in the pogo frame 40 in a grid pattern.

7 Claims, 8 Drawing Sheets

FIG. 4
(A)
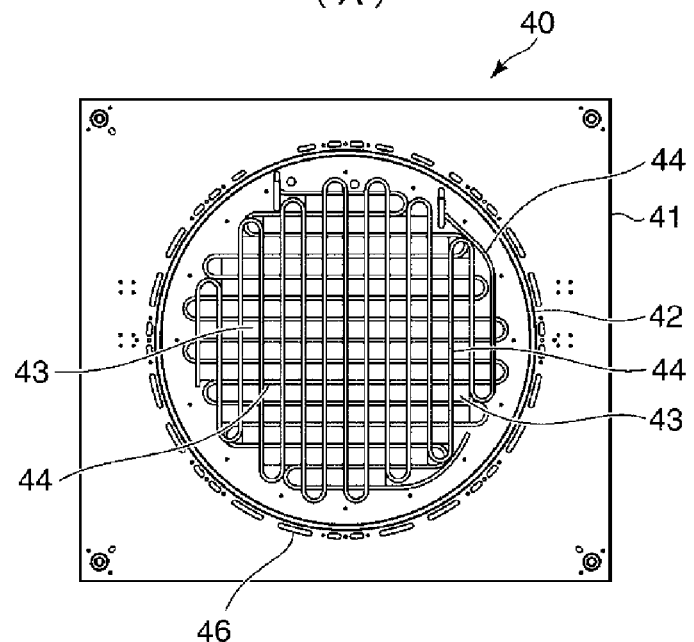
(B)
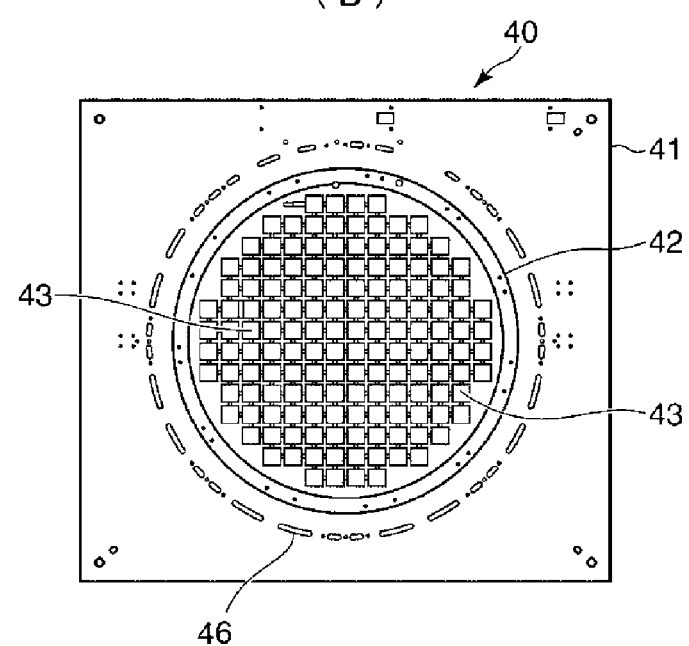

FIG. 8
(A)
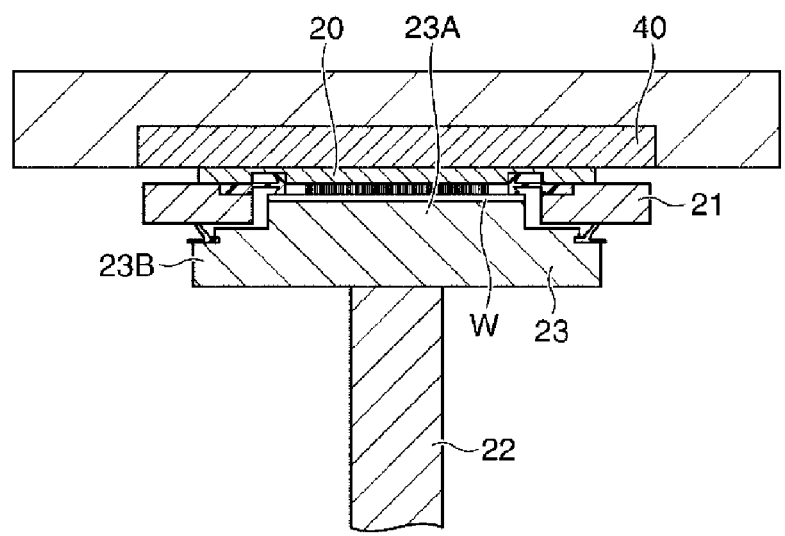
(B)
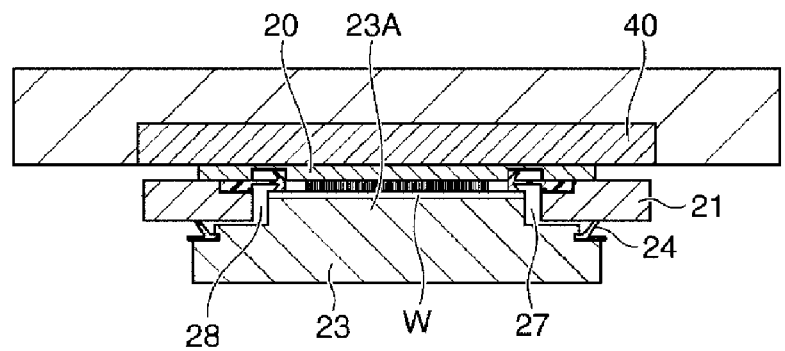
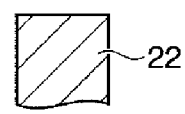

WAFER INSPECTION INTERFACE AND WAFER INSPECTION APPARATUS

CROSS-REFERENCE TO RELATED APPLICATION

This application claims the benefit of Japanese Patent Application No. 2012-052914 filed on Mar. 9, 2012, the entire disclosures of which are incorporated herein by reference.

FIELD OF THE INVENTION

The present disclosure relates to a wafer inspection interface including a probe card and also relates to a wafer inspection apparatus.

BACKGROUND OF THE INVENTION

As a wafer inspection apparatus, there is known, for example, a burn-in inspection apparatus or a probe apparatus that inspects electrical characteristics of a multiple number of semiconductor devices formed on a wafer.

FIG. 9 is a cross sectional view illustrating a schematic configuration of a conventional probe apparatus, and FIG. 10 is a cross sectional view illustrating a pogo frame (pogo ring) in the conventional probe apparatus of FIG. 9.

Referring to FIG. 9, a probe apparatus 100 includes a loader chamber 101 serving as a wafer transfer section for transferring a wafer W; and an inspection chamber 102 for performing therein an inspection of electrical characteristics of a multiple number of semiconductor devices formed on the wafer W. This probe apparatus 100 is configured to inspect the electrical characteristics of the semiconductor devices by controlling various types of devices in the loader chamber 101 and the inspection chamber 102 under the control of a controller. The inspection chamber 102 includes a mounting table 106, a pogo frame 109, a probe card 108, and an alignment device 110. The mounting table 106 mounts thereon a wafer W loaded from the loader chamber 101 and is configured to be movable in X, Y, Z and θ directions. The pogo frame 109 is disposed above the mounting table 106, and the probe card 108 is supported on the pogo frame 109. The alignment device 110 is configured to perform alignment (position adjustment) between a multiple number of probes (inspection needles) of the probe card 108 and electrodes of the semiconductor devices formed on the wafer W in cooperation with the mounting table 106. After the wafer W and the probe card 108 are aligned with each other by the alignment device 110 and the mounting table 106 in cooperation, each probe of the probe card 108 is brought into contact with the electrodes of the wafer W, so that electrical characteristics of the multiple number of semiconductor devices formed on the wafer W are inspected (see, for example, Patent Document 1).

In FIG. 10, the pogo frame 109 is supported by a conversion ring 112 and is fastened to an upper plate of the probe apparatus 100 via the conversion ring 112. The pogo frame 109 includes an opening 109A formed through a central portion of the pogo frame 109 in its thickness direction; and a ring portion 109B surrounding the opening 109A. A multiple number of pogo pins 109C are arranged to penetrate the ring portion 109B in the thickness direction thereof. The pogo pins 109C are in contact with connecting terminals 108A formed on a periphery portion of the probe card 108 disposed under the pogo frame 109. The pogo pins 109C serve to electrically connect probes 108B provided on a central portion of a bottom surface of the probe card 108 with a non-illustrated inspection apparatus. The probes 108B are brought into contact with corresponding electrodes of the semiconductor devices, which are placed under the probes 108B, formed on the wafer W. A stiffener 113 made of, e.g., a flat plate-shaped metal member is provided within the opening 109A of the pogo frame 109 in order to prevent deformation of the probe card 108.

Since semiconductor devices may be used in a high temperature atmosphere, inspection of the electrical characteristics of the semiconductor devices formed on the wafer may also be performed in a high temperature state. The wafer and the probe card may expand and contract as temperature varies. Accordingly, in a high temperature atmosphere of, e.g., about 90° C., positions of the electrodes of the semiconductor devices formed on the wafer and positions of the probes provided on the probe card may be deviated from each other due to a difference in their thermal expansion coefficients. As a result, the probes of the probe card may not be accurately brought into contact with the corresponding electrodes of the semiconductor devices, so that the inspection of the electrical characteristics of the semiconductor devices may not be performed appropriately.

To solve the problem, in the conventional probe apparatus, a low-expansion material having a thermal expansion coefficient close to that of the wafer W may be used as the stiffener disposed within the opening 109A of the pogo frame 109. In this way, the thermal expansion coefficients of the wafer W and the probe card 108 fastened to the pogo frame 109 may be apparently made equivalent to each other. As a result, a discrepancy in positions of the probes of the probe card 108 and positions of the electrodes of the semiconductor devices on the wafer W may be reduced.

Patent Document 1: Japanese Patent Laid-open Publication No. 2004-140241

However, in a wafer inspection apparatus concerned in the present disclosure, a multiple number of inspection chambers are arranged in a 3-dimensional grid shape, and it is attempted to reduce the weight and the size of the inspection apparatus by sharing many devices by, for example, aligning wafers in a common place other than the respective inspection chambers. Accordingly, in each inspection chamber, a stiffener for obtaining required stiffness is not provided. Further, in the wafer inspection apparatus concerned in the present disclosure, each inspection chamber is configured as a whole contact type apparatus allowing all the probes formed on the probe card are brought into contact with all the electrodes of the semiconductor devices formed on the wafer at one time. For this configuration, the multiple number of pogo pins are inserted over an entire surface of the pogo frame that supports the probe card, and, thus, the stiffness of the probe card fastened to the pogo frame is obtained. Further, since there is no extra space for accommodating therein a stiffener, the stiffener has not been provided.

That is, in the wafer inspection apparatus concerned in the present disclosure, it is not possible to make a thermal expansion coefficient of the probe card apparently equivalent to a thermal expansion coefficient of the wafer by selecting a material for the stiffener as in the conventional probe apparatus, and, thus, it is not possible to resolve a discrepancy in the positions of the electrodes of the semiconductor devices formed on the wafer and the positions of the probes formed on the probe card due to a difference in temperature variation. Accordingly, it is required to resolve such a discrepancy.

BRIEF SUMMARY OF THE INVENTION

In view of the foregoing problems, illustrative embodiments provide a wafer inspection interface and a wafer inspection apparatus capable of appropriately inspecting electrical characteristics of semiconductor devices formed on a wafer by resolving a discrepancy in positions of the wafer and a probe card due to a difference in thermal expansion therebetween and by accurately aligning probes of the probe card with electrodes of the semiconductor devices formed on the wafer.

In accordance with one aspect of an illustrative embodiment, there is provided a wafer inspection interface. The wafer inspection interface includes a probe card having a multiple number of probes at a surface of the probe card facing a wafer and the probes are arranged to correspond to electrodes of a multiple number of semiconductor devices formed on the wafer; a frame that is in contact with a surface of the probe card opposite to the surface of the probe card facing the wafer and supports the probe card; and a heating member provided in the frame.

The heating member may include a linear heater.

The frame may have a multiple number of rectangular through holes, and the linear heater may be provided along respective sides of the through holes.

The linear heater may be provided in a grid pattern.

The linear heater may be provided at a side of a contact surface between the frame and the probe card on a cross section of the frame in a thickness direction thereof.

The probes of the probe card may be arranged previously offset such that when the probe card thermally expands by being heated to a predetermined temperature, each of the probes comes into contact with each of the electrodes of the semiconductor devices on the wafer heated to the predetermined temperature.

The predetermined temperature may be in the range from about, e.g., −30° C. to about +100° C.

Each of pogo pins may be inserted into each of the through holes.

In accordance with another aspect of the illustrative embodiment, there is provided a wafer inspection apparatus having an inspection chamber for inspecting electrical characteristics of semiconductor devices formed on a wafer; and a transfer device for loading and unloading the wafer into and from the inspection chamber. The wafer inspection apparatus includes a wafer inspection interface. Further, the a wafer inspection interface includes a probe card having a multiple number of probes at a surface of the probe card facing a wafer and the probes are arranged to correspond to electrodes of a multiple number of semiconductor devices formed on the wafer; a frame that is in contact with a surface of the probe card opposite to the surface of the probe card facing the wafer and supports the probe card; and a heating member provided in the frame.

In accordance with the illustrative embodiment, the heating member is provided at the frame that supports the probe card by coming into contact with the surface of the probe card opposite to the surface of the probe card facing the wafer. The probe card is heated in advance to have a temperature where the electrical characteristics of semiconductor devices are inspected by the heating member. Further, the probes are arranged such that when the probe card is heated to have the temperature where the electrical characteristics of semiconductor devices are inspected, each probe comes into contact with each of the electrodes of the semiconductor devices on the wafer heated to have the temperature where the electrical characteristics of semiconductor devices are inspected. Accordingly, by using the probe card have the above-described configuration, the positions of the electrodes of the semiconductor devices on the wafer and the positions of the probes of the probe card can be accurately aligned with each other. As a result, it is possible to appropriately inspect the electrical characteristics of the semiconductor devices formed on the wafer.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 4 illustrates a frame (pogo frame) in FIG. 3, and FIG. 4(A) is a top view showing a front surface thereof and FIG. 4(B) is a bottom view showing a rear surface thereof;

FIG. 8 is a process diagram for inspecting electrical characteristics of each semiconductor device on a wafer by using the wafer inspection interface of FIG. 5;

DETAILED DESCRIPTION OF THE INVENTION

Hereinafter, illustrative embodiments will be described in detail with reference to the accompanying drawings.

Figure 1:
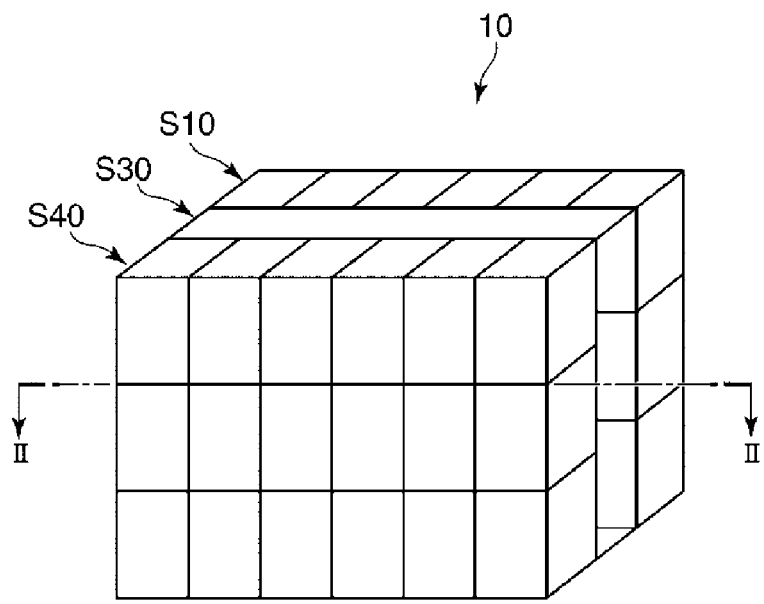
FIG. 1 is a perspective view illustrating an exterior view of a wafer inspection apparatus in accordance with an illustrative embodiment.

FIG. 1 is a perspective view illustrating an exterior view of a wafer inspection apparatus in accordance with an illustrative embodiment. The wafer inspection apparatus 10 is configured as a whole contact type inspection apparatus that inspects electrical characteristics by bringing all probes of a probe card into contact with all electrodes of semiconductor devices formed on a wafer at one time. This wafer inspection apparatus 10 is developed based on the technical concept of sharing many devices. Accordingly, in order to reduce a size of the apparatus, a wafer is aligned at a place other than an inspection chamber.

In FIG. 1, the wafer inspection apparatus 10 includes a loading/unloading section S10, provided at a rear side of the wafer inspection apparatus 10, for loading and unloading a wafer; an inspection section S40 provided at a front side of the wafer inspection apparatus 10 while facing the loading/unloading section S10; and a transfer section S30 provided between the loading/unloading section S10 and the inspection section S40.

The loading/unloading section S10 is partitioned into a multiple number of unit loading/unloading areas corresponding to a multiple number of mounting devices. The inspection section S40 is also partitioned into a multiple number of unit inspection areas corresponding to a multiple number of inspection chambers. That is, each of the loading/unloading section S10 and the inspection section S40 is partitioned into the multiple number of chambers in a 3-dimensional grid shape. A wafer transfer device to be described later (see FIG. 2) is moved in the transfer section S30 between the loading/unloading section S10 and the inspection section S40.

Figure 2:
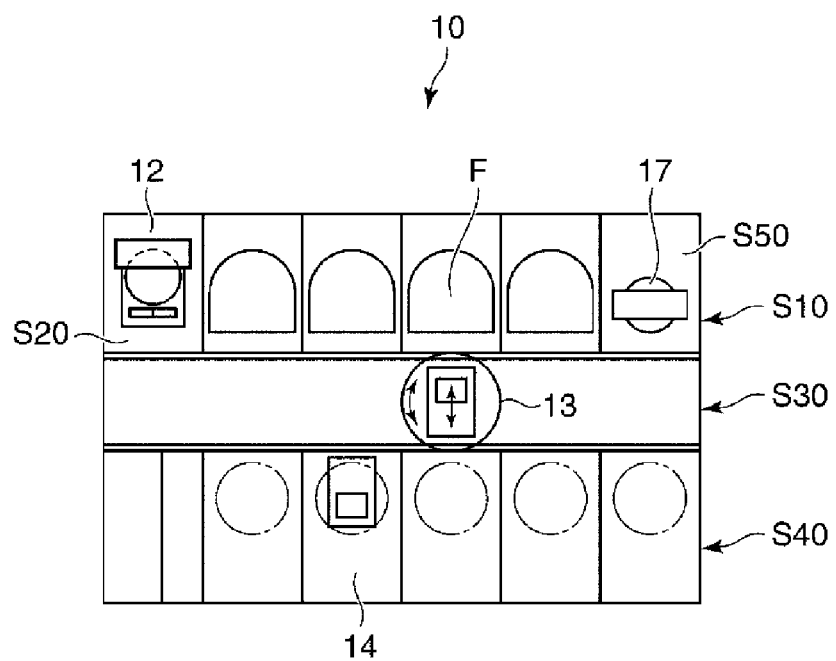
FIG. 2 is a cross sectional view taken along a line II-II of FIG. 1.

FIG. 2 is a cross sectional view taken along a line II-II of FIG. 1.

Referring to FIG. 2, a multiple number of accommodation devices for accommodating therein FOUPs F is provided in the loading/unloading section S10 as example mounting devices. An alignment section S20 including an alignment chamber 12 is provided at a left end of the loading/unloading section S10. A needle mark inspection section S50 including a needle mark inspection apparatus 17 is provided at a right end of the loading/unloading section S10. Further, a wafer transfer device 13 is provided in the transfer section S30, and a multiple number of inspection chambers 14 are arranged in the inspection section S40.

The wafer transfer device 13 includes, for example, a rotational body provided on a base; two vertically arranged arms, i.e., an upper arm and a lower arm, configured to be individually moved back and forth on the rotational body in one direction; an elevation device configured to move the base and the arms up and down; and a moving device configured to move these devices back and forth along the transfer section S30. A pick 13B for mounting and carrying a wafer W thereon is provided at a leading end of the upper arm 13A. Further, a heating device 13C is embedded in the pick 13B (as will be described with reference to FIG. 3). When inspecting electrical characteristics of semiconductor devices formed on the wafer W, the heating device 13C heats the wafer W to a temperature where the electrical characteristics of semiconductor devices are inspected (hereinafter, referred to as "electrical characteristic inspection temperature"). The heating device 13C may be formed by, for example, a heat transfer heater.

In the wafer inspection apparatus 10, the wafer transfer device 13 receives an uninspected wafer W and transfers the uninspected wafer W into the alignment chamber 12 from a FOUP F. In the alignment chamber 12, alignment of the wafer W with the pick 13B of the wafer transfer device 13 is performed. Then, the wafer transfer device 13 transfers the aligned wafer W into an inspection chamber 14. While transferred into the inspection chamber 14, the wafer W is heated to the electrical characteristic inspection temperature by the heating device 13C embedded in the pick 13B. The inspection chamber 14 includes a wafer inspection interface 18 to be described later. The wafer inspection interface 18 is configured to inspect electrical characteristics of semiconductor devices formed on the wafer W.

Further, the wafer transfer device 13 transfers the inspected wafer W from the inspection chamber 14 to the needle mark inspection device 17 disposed in the needle mark inspection section S50 located at one end of the loading/unloading section S10. The needle mark inspection device 17 is configured to inspect a needle mark (i.e., a mark of a contact with a probe 25) on an electrode of the respective semiconductor devices on the inspected wafer W. Then, the wafer transfer device 13 loads the inspected wafer W into the FOUP F within the loading/unloading section S10. While transferred into the FOUP F, the inspected wafer W is cooled to a room temperature.

Here, the wafer transfer device 13 transfers a first wafer W unloaded from a first FOUP F into a first inspection chamber 14 via the alignment chamber 12. While inspecting the electrical characteristics of semiconductor devices formed on the first wafer W in the first inspection chamber 14, the wafer transfer device 13 may transfer a second wafer W unloaded from a second FOUP F into a second inspection chamber 14 via the alignment chamber 12. Alternatively, while inspecting the electrical characteristics of the semiconductor devices formed on the first wafer W in the first inspection chamber 14, the wafer transfer device 13 may unload an inspected third wafer W from a third inspection chamber and load the inspected third wafer W into a third FOUP F. That is, the wafer transfer device 13 transfers the wafers W in sequence between the multiple number of FOUPs F and the multiple number of inspection chambers 14, and electrical characteristics of semiconductor devices formed on the wafers W are inspected in sequence in the respective inspection chambers 14.

Figure 3:
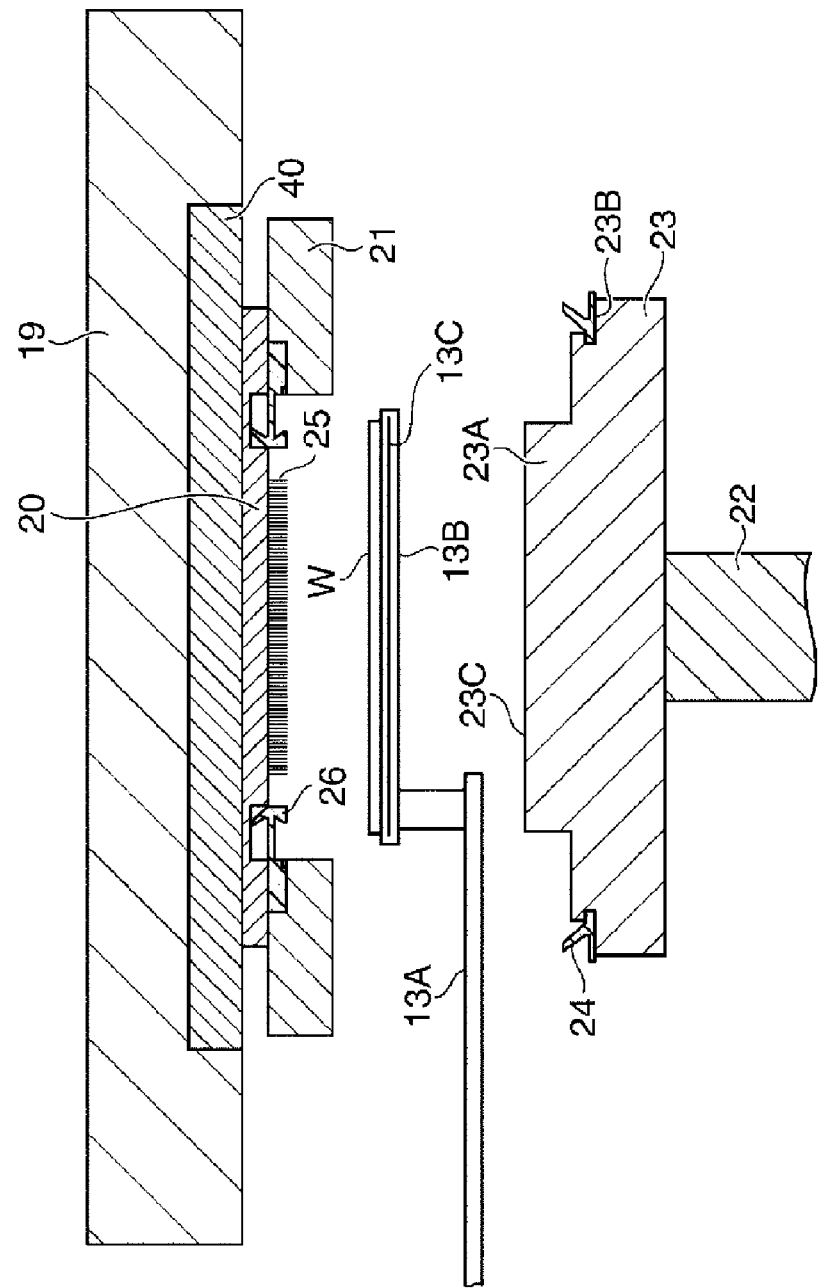
FIG. 3 is a cross sectional view schematically illustrating a configuration of a wafer inspection interface included in an inspection chamber of FIG. 2.

FIG. 3 is a cross sectional view schematically illustrating a configuration of a wafer inspection interface included in the inspection chamber of FIG. 2.

Referring to FIG. 3, the wafer inspection interface 18 includes a head plate 19, a frame (hereinafter, referred to as a "pogo frame") 40, a probe card 20, a fixing ring 21, a rod-shaped lifter 22 and a table-shaped chuck top 23. The head plate 19 is provided at a ceiling portion of the inspection chamber 14 and is made of a plate-shaped member. The pogo frame 40 forms a bottom surface of the head plate 19. The probe card 20 is disposed to be in contact with a bottom surface of the pogo frame 40. The fixing ring 21 holds the periphery of the probe card 20 and supports the probe card 20 to the pogo frame 40. The lifter 22 stands uprightly from a bottom portion of the inspection chamber 14 and is configured to be moved up and down. The chuck top 23 is provided on a top portion of the lifter 22. The chuck top 23 has a cross section in which a central portion of the chuck top 23 is protruded. Further the chuck top 23 includes an upwardly protruding portion 23A; and a step-shaped portion 23B surrounding the protruding portion 23A and formed to be lower than the protruding portion 23A. A top flat surface of the protruding portion 23A serves as a wafer mounting surface 23C on which the wafer W is mounted.

FIG. 4 illustrates the pogo frame 40 of FIG. 3. FIG. 4(A) is a top view showing a front surface of the pogo frame 40, and FIG. 4(B) is a bottom view showing a rear surface of the pogo frame 40.

In FIGS. 4(A) and 4(B), the pogo frame 40 includes a pogo frame main body 41; a contact area 42 formed at a central portion of the pogo frame main body 41 to be in contact with the probe card 20; and a multiple number of through hole 43 formed at the contact area 42. The pogo frame main body 41 is a rectangular plate-shaped body having a size of, e.g., about 450 mm×about 500 mm, and is made of a low thermal expansion material such as Invar. A thickness of the pogo frame main body 41 is, e.g., about 10 mm. The central contact area 42 is a circular area of about 300 mmφ, and the through holes 43 are regularly formed at the central contact area 42. Here, each of the through holes 43 has a square shape of which one side length is, e.g., about 16.5 mm. However, a shape of the through hole 43 may not be limited thereto, and, by way of example, each of the through holes 43 may have a rectangle shape. Further, pogo pins are inserted into the through holes 43.

As shown in FIG. 4(A), a linear heater 44 as a heating device is provided along the respective sides of the square-shaped through holes 43 in a grid pattern. By way of example, a sheath heater may be appropriately used as the linear heater 44. The sheath heater is a straight tube-shaped heater obtained by inserting a heating coil in the center of a stainless steel pipe having a cross section of, e.g., about 2 mmφ and by filling and hardening a gap between the pipe and the heating coil with MgO powder. This sheath heater can be bent and has a long life time.

A multiple number of through holes 46 for heat insulation are formed around the contact area 42. The through holes 46 are formed through the pogo frame main body in a thickness direction thereof and serve to reduce a heat loss by heat conduction.

The linear heater (hereinafter, referred to as "sheath heater") 44 provided at the pogo frame 40 is configured to heat the probe card 20 in contact with the pogo frame 40. When viewed from a cross section thereof, it is desirable to locate the sheath heater 44 at a position close to a contact surface between the pogo frame 40 and the probe card 20. With this configuration, a heat transfer efficiency of the sheath heater 44 can be improved. Further, by heating the probe card 20 to a temperature equal to, e.g., an electrical characteristic inspection temperature of the wafer W in a short period of time, positions of electrodes of semiconductor devices formed on the wafer W and positions of the probes 25 on the probe card 20 can be aligned with each other.

Figure 5:
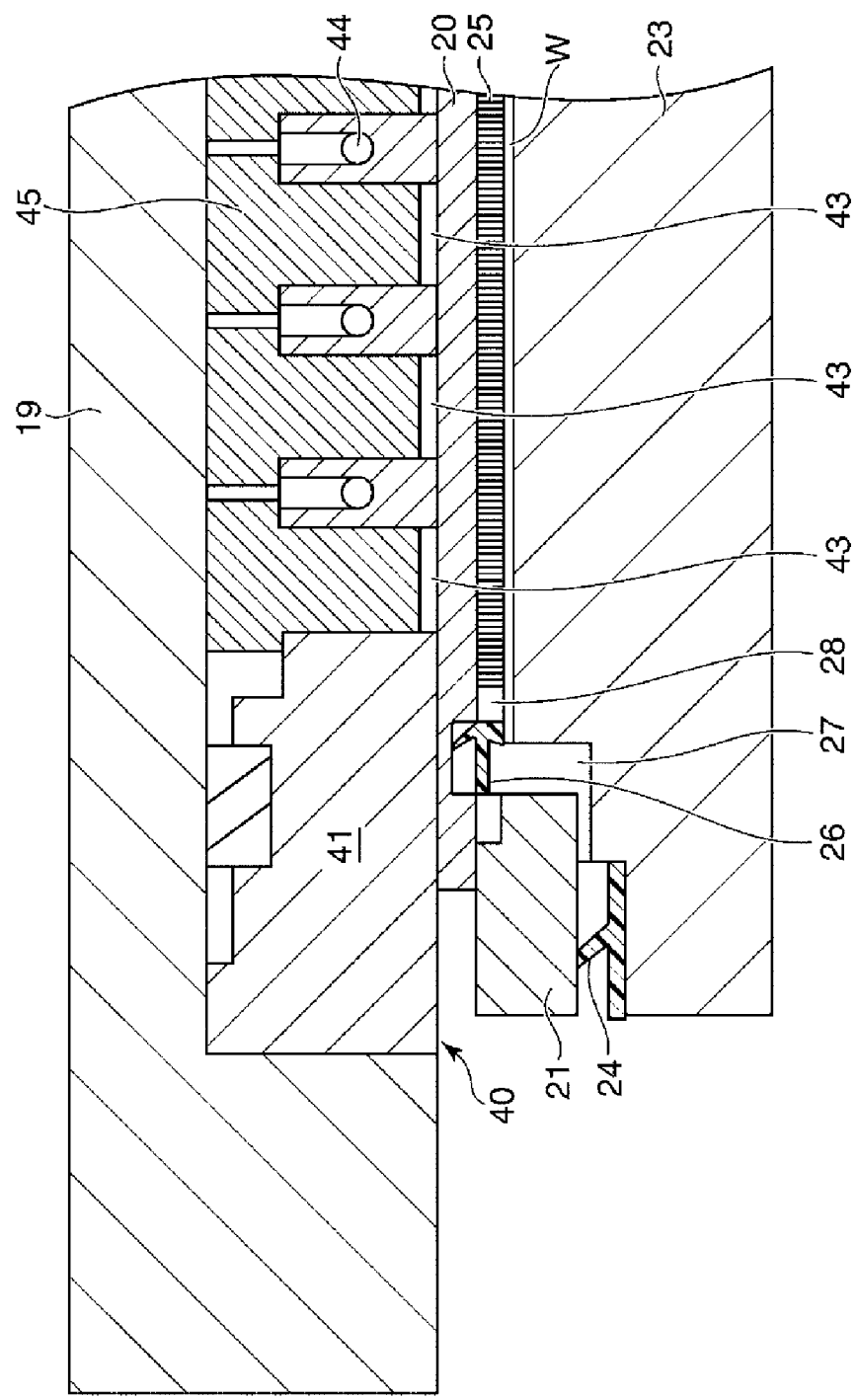
FIG. 5 is a partially enlarged cross sectional view of the wafer inspection interface shown in FIG. 3.

FIG. 5 is a partially enlarged cross sectional view of the wafer inspection interface of FIG. 3.

In FIG. 5, the wafer inspection interface 18 includes the probe card 20 having the multiple number of probes 25 on its surface facing a wafer W; the table-shaped chuck top 23 disposed to face the probe card 20 with the wafer W therebetween; and the pogo frame 40 in contact with a surface of the probe card 20 opposite to the surface facing the wafer W and supporting the probe card 20.

Figure 6:
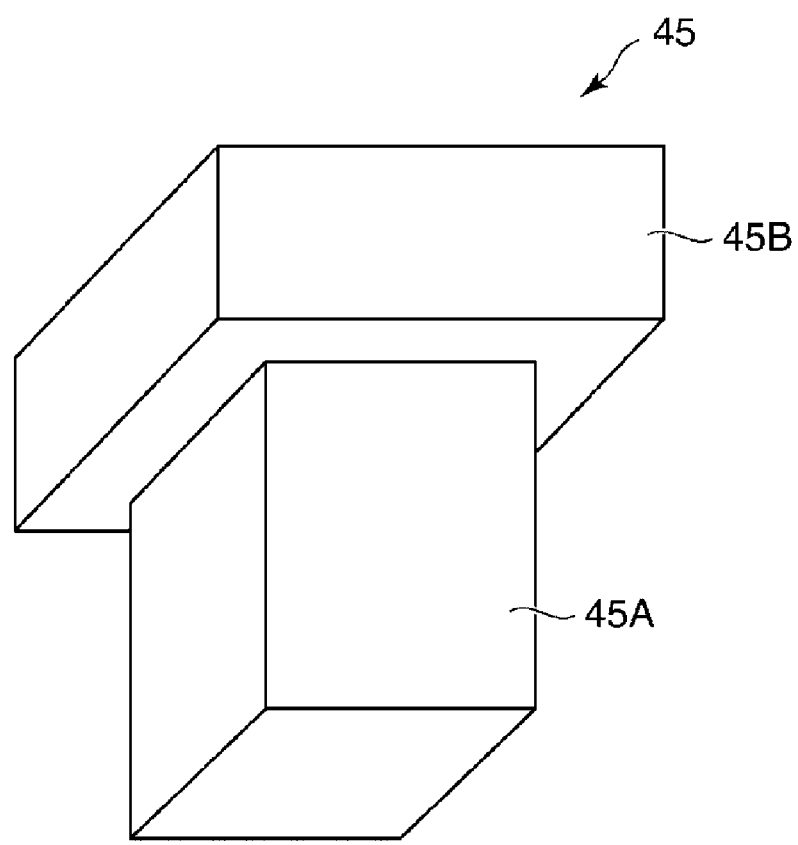
FIG. 6 is a perspective view illustrating a pogo pin inserted into and fitted to the frame (pogo frame) of FIG. 4.

The multiple number of through holes 43, through which pogo pins 45 are inserted, are formed in the pogo frame main body 41 of the pogo frame 40. Each through hole 43 has, e.g., a square cross sectional shape, and the sheath heater 44 is provided along the respective through holes 43 in, e.g., a grid pattern (see FIG. 4). Each pogo pin 45 includes a protruding portion 45A of a square pillar shape having a square cross section; and a step-shaped portion 45B formed around the protruding portion 45A, as shown in FIG. 6. The protruding portion 45A of the pogo pin 45 is inserted into corresponding one of the through holes 43. The pogo pins 45 electrically connects the probe card 20 with a non-illustrated inspection apparatus provided on the head plate 19.

Referring back to FIG. 5, the probe card 20 has the multiple number of probes (inspection needles) 25 on its surface facing the wafer W. The probes 25 are arranged to correspond to electrodes of semiconductor devices formed on the wafer W, respectively. The fixing ring 21 is disposed to surround an arrangement area of the probes 25 on the probe card 20. The fixing ring 21 supports the probe card 20 to the pogo frame 40.

Further, an inner space 28 is formed between the probe card 20 and the wafer W, and an outer space 27 surrounding the inner space 28 is formed between the chuck top 23 and the fixing ring 21. The inner space 28 and the outer space 27 are sealed by seal members 26 and 24, respectively (see FIG. 3).

Now, a process of inspecting electrical characteristics of semiconductor devices on a wafer by using the wafer inspection apparatus having the wafer inspection interface configured as described above will be explained.

Figure 7:
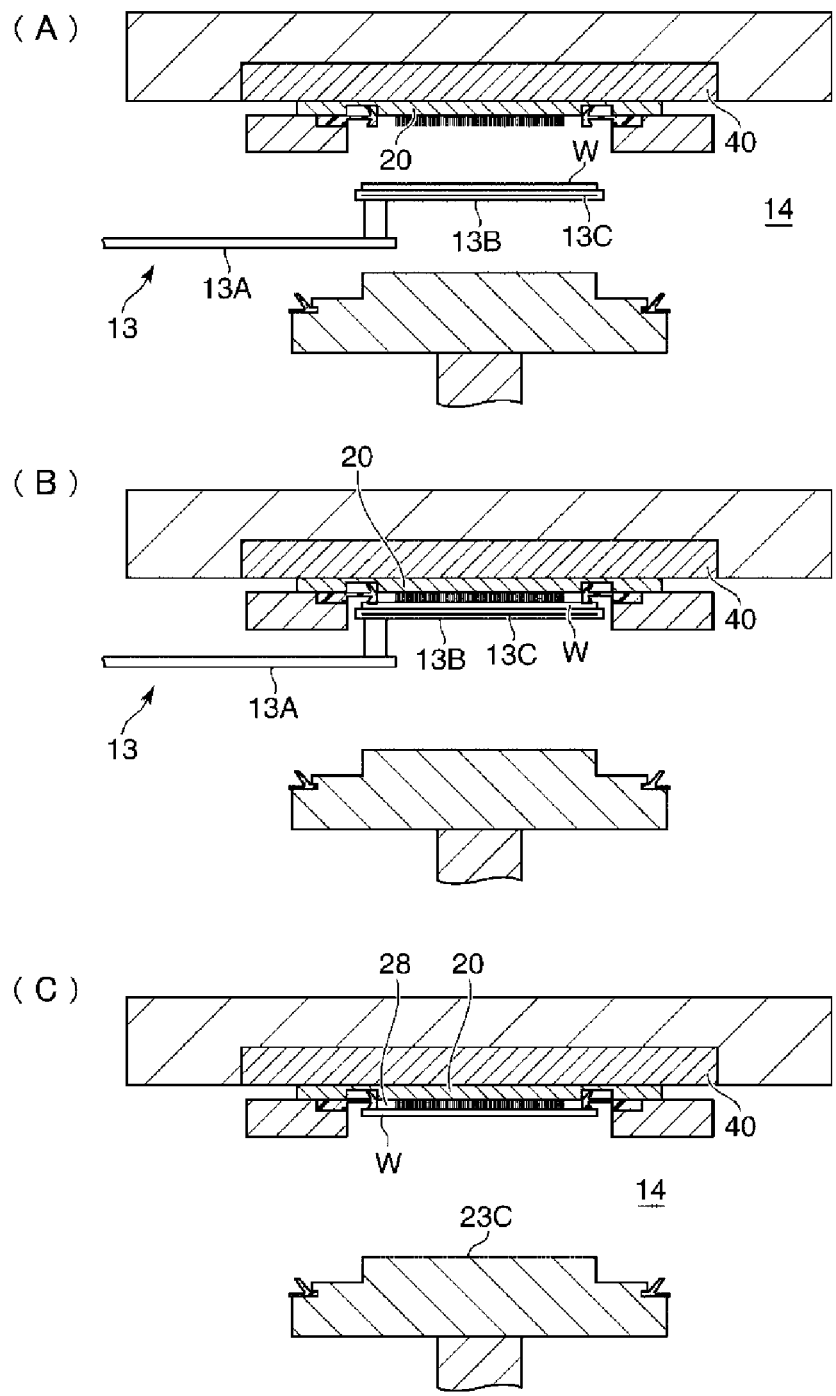
FIG. 7 is a process diagram for inspecting electrical characteristics of each semiconductor device on a wafer by using the wafer inspection interface of FIG. 5.
Figure 9:
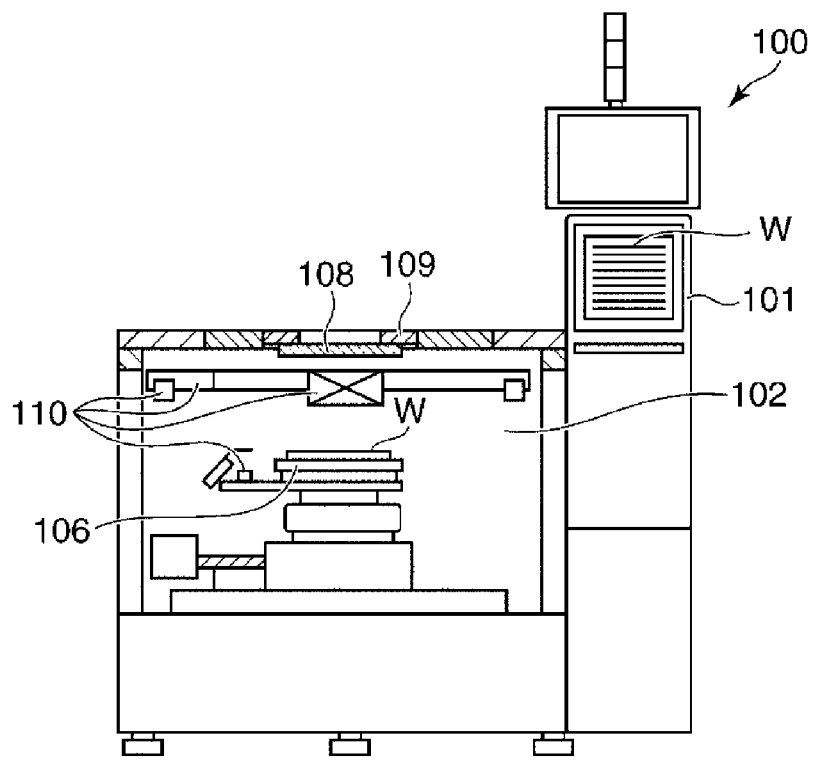
FIG. 9 is a cross sectional view illustrating a schematic configuration of a conventional probe apparatus.
Figure 10:
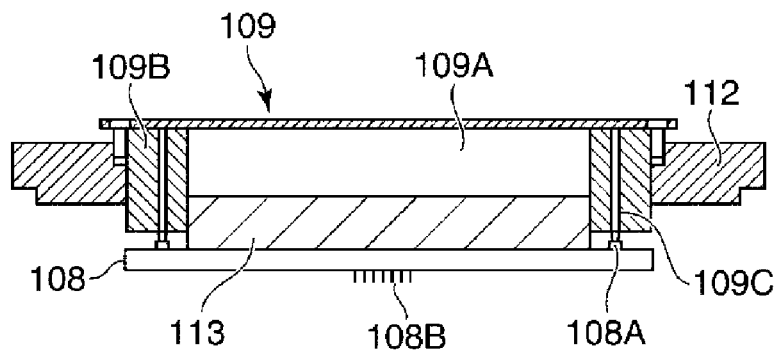
FIG. 10 is a cross sectional view illustrating a pogo frame in FIG. 9.

FIGS. 7 and 8 are process diagrams for inspecting electrical characteristics of semiconductor devices on a wafer using the wafer inspection apparatus of FIG. 5.

First, before loading a wafer W into the inspection chamber 14, the probe card 20 in contact with the pogo frame is previously heated to the electrical characteristic inspection temperature of the wafer W, e.g., about 90° C. by the sheath heater 44 provided at the pogo frame 40. Since the sheath heater 44 is provided in the grid pattern along the respective sides of the through holes 43 of the pogo frame 40 and located near the contact surface between the pogo frame 40 and the probe card 20, it is possible to efficiently heat the probe card 20.

Subsequently, the wafer W is loaded into the inspection chamber 14 by the wafer transfer device 13. That is, the wafer W aligned with the pick 13B of the wafer transfer device 13 and heated to the electrical characteristic inspection temperature of, e.g., about 90° C. by the heating device 13C embedded in the pick 13B is transferred by the wafer transfer device 13 into the inspection chamber 14, and then, is positioned to face the probe card 20. At this time, the wafer transfer device 13 aligns the pick 13B with the probe card 20 by moving the arm 13A of the wafer transfer device 13 slightly (see FIG. 7(A)). Accordingly, the wafer W and the probe card 20 are aligned with each other.

Thereafter, the wafer transfer device 13 brings the wafer W into contact with the probe card 20 by moving the pick 13B toward the probe card 20. At this time, since the wafer W and the probe card 20 have been already aligned with each other and both the wafer W and the probe card 20 are controlled to have the electrical characteristic inspection temperature of the wafer W, e.g., to about 90° C. each probe 25 of the probe card 20 is accurately brought into contact with each of the electrodes of the semiconductor devices formed on the wafer W (see FIG. 7(B)). The probes 25 provided on a surface of the probe card 20 facing the wafer W are arranged previously offset at a room temperature such that when the probe card 20 thermally expands at about 90° C., each probe 25 comes into contact with each of the electrodes of the semiconductor devices on the wafer W heated to 90° C. and thermally expanded.

Then, by depressurizing the inner space 28 between the probe card 20 and the wafer W, the wafer W is attracted toward and temporarily held by the probe card 20. Thereafter, the pick 13B is separated from the wafer W and is retreated out of the inspection chamber 14 by the wafer transfer device 13 (see FIG. 7(C)).

Subsequently, the lifter 22 for supporting the chuck top 23 moves the chuck top 23 upward and brings the chuck top 23 into contact with the fixing ring 21. At this time, since the protruding portion 23A of the chuck top 23 protrudes upward from the step-shaped portion 23B, the wafer mounting surface 23C, i.e., the top flat surface of the protruding portion 23A, comes into contact with the wafer W temporarily held by the probe card 20. As a result, the wafer W is mounted on the wafer mounting surface 23C (FIG. 8(A)).

Then, the chuck top 23 is brought into contact with the fixing ring 21, and the outer space 27 formed between the chuck top 23 and the fixing ring 21 is depressurized. Accordingly, the chuck top 23 is attracted toward the fixing ring 21 and indirectly held by the fixing ring 21. At this time, the chuck top 23 attracted to the fixing ring 21 presses the wafer W located on the wafer mounting surface 23C toward the probe card 20. Since, however, the chuck top 23 has higher stiffness than that of the wafer W, the wafer W can be uniformly pressed toward the probe card 20. Thereafter, the lifter 22 is moved downward and separated from the chuck top 23 (FIG. 8(B)).

Subsequently, an electric current of a preset value flows to the electrodes of the semiconductor devices from the probes 25 of the probe card 20, and electrical characteristics of the semiconductor devices are inspected at one time. Then, the inspection process is finished.

In accordance with the present illustrative embodiment, the sheath heater 44 is provided at the pogo frame 40 that supports the probe card 20 by coming into contact with the surface of the probe card 20 opposite to the surface of the probe card 20 facing the wafer W, and the probe card 20 can be heated in advance to have the electrical characteristic inspection temperature of the semiconductor devices by the sheath heater 44. Further, the probes 25 are arranged such that when the probe card 20 is heated to have the electrical characteristic inspection temperature, each probe 25 comes into contact with each of the electrodes of the semiconductor devices on the wafer heated to have the electrical characteristic inspection temperature. Accordingly, by using the probe card 20 have the above-described configuration, the positions of the electrodes of the semiconductor devices on the wafer W and the positions of the probes of the probe card 20 can be accurately aligned with each other. As a result, it is possible to appropriately inspect the electrical characteristics of the semiconductor devices formed on the wafer. Furthermore, the probe card 20 is heated to the electrical characteristic inspection temperature of the wafer W in advance before the probe card 20 comes into contact with the wafer W. Accordingly, the probes 25 of the probe card 20 can be prevented from being overheated after coming into contact with the semiconductor devices formed on the wafer W, and the positions of the electrodes of the semiconductor devices can be prevented from being deviated. Thus, it is possible to suppress production of defective products.

Furthermore, in accordance with the present illustrative embodiment, since the sheath heater 44 is a linear heater, it is possible to uniformly arrange the sheath heater 44 in the grid pattern along the respective sides of the through holes 43. Thus, the probe card 20 can be uniformly heated.

In accordance with the present illustrative embodiment, the electrical characteristic inspection temperature of the semiconductor devices formed on the wafer W ranges from, e.g., about 50° C. to about 150° C., desirably, e.g., about 60° C. to about 90° C. If the electrical characteristic inspection temperature is excessively high, the seal members or the like may not maintain their thermal resistance. Meanwhile, if the electrical characteristic inspection temperature is excessively low, the sheath heater 44 may not effectively function as the heating member.

In accordance with the present illustrative embodiment, the electrical characteristics of the semiconductor devices on the wafer W are inspected by contacting each of the probes 25 of the probe card 20 with each of the electrodes of all semiconductor devices on the wafer W at one time. Accordingly, productivity of the semiconductor devices can be improved.

Moreover, in the wafer inspection apparatus in accordance with the present illustrative embodiment, since the wafer W is aligned at a place other than the inspection chamber 14, temperature management for the wafer W and the probe card 20 to be brought into contact with the wafer W is important. As a resolution, by heating the probe card 20 to the certain temperature by the sheath heater 44 provided at the pogo frame 40, the temperature management can be performed effectively.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

What is claimed is:

1. A wafer inspection interface comprising:
a probe card having a multiple number of probes on a bottom surface of the probe card facing a wafer, the probes being arranged to correspond to electrodes of a plurality of semiconductor devices formed on the wafer;
a frame that is in contact with an upper surface of the probe card and supports the probe card; and
a heating member provided within the frame and at a position proximate a contact surface between the frame and the upper surface of the probe card, a bottom surface of the frame being in direct contact with the upper surface of the probe card,
wherein the frame and the heating member are vertically aligned with an area of the electrodes where the multiple number of probes are brought into contact with the electrodes,
the heating member includes a linear heater,
the frame has a multiple number of rectangular through holes, and
the linear heater is outside of the rectangular through holes and is provided along respective sides of the rectangular through holes.

2. The wafer inspection interface of claim 1,
wherein the linear heater is provided in a grid pattern.

3. The wafer inspection interface of claim 1,
wherein the linear heater is provided at a side of a contact surface between the frame and the probe card on a cross section of the frame in a thickness direction thereof.

4. The wafer inspection interface of claim 1,
wherein the probes of the probe card are arranged previously offset such that when the probe card thermally expands by being heated to a predetermined temperature, each of the probes comes into contact with each of the electrodes of the semiconductor devices on the wafer heated to the predetermined temperature.

5. The wafer inspection interface of claim 4,
wherein the predetermined temperature is in the range from about −30° C. to about +100° C.

6. The wafer inspection interface of claim 1,
wherein a pogo pin is inserted into each of the through holes.

7. A wafer inspection apparatus having an inspection chamber for inspecting electrical characteristics of semiconductor devices formed on a wafer; and a transfer device for loading and unloading the wafer into and from the inspection chamber, the wafer inspection apparatus comprising:
a wafer inspection interface including:
a probe card having a multiple number of probes on a bottom surface of the probe card facing a wafer, the probes being arranged to correspond to electrodes of a plurality of semiconductor devices formed on the wafer;
a frame that is in contact with an upper surface of the probe card and supports the probe card; and
a heating member provided within the frame and at a position proximate a contact surface between the frame and the upper surface of the probe card, a bottom surface of the frame being in direct contact with the upper surface of the probe card,
wherein the frame and the heating member are vertically aligned with an area of the electrodes where the multiple number of probes are brought into contact with the electrodes,
the heating member includes a linear heater,
the frame has a multiple number of rectangular through holes, and the linear heater is outside of the rectangular through holes and is provided along respective sides of the rectangular through holes.

* * * * *